(12) United States Patent
Tang et al.

(10) Patent No.: US 8,164,003 B2
(45) Date of Patent: Apr. 24, 2012

(54) CIRCUIT BOARD SURFACE STRUCTURE AND FABRICATION METHOD THEREOF

(75) Inventors: Sao-Hsia Tang, Hsinchu (TW); Ying-Tung Wang, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 1084 days.

(21) Appl. No.: 12/043,597

(22) Filed: Mar. 6, 2008

(65) Prior Publication Data

US 2008/0217046 A1    Sep. 11, 2008

(30) Foreign Application Priority Data

Mar. 7, 2007   (TW) .............................. 96107787 A

(51) Int. Cl.
*H05K 1/09* (2006.01)
(52) U.S. Cl. ........ 174/261; 174/257; 257/737; 361/767; 361/768; 438/613
(58) Field of Classification Search ............... 174/263, 174/250–258, 261; 29/825, 829–831, 866–867, 29/852, 874; 361/760, 762, 771, 795, 803, 361/808, 812, 820, 767, 748–750, 768; 438/612, 438/613; 257/693, 737
See application file for complete search history.

(56) References Cited

U.S. PATENT DOCUMENTS

| 5,260,518 | A | * | 11/1993 | Tanaka et al. | 174/261 |
| 6,395,993 | B1 | * | 5/2002 | Nakamura et al. | 174/254 |
| 6,586,843 | B2 | * | 7/2003 | Chen et al. | 257/778 |
| 6,639,299 | B2 | * | 10/2003 | Aoki | 257/531 |
| 6,809,415 | B2 | * | 10/2004 | Tsukada et al. | 257/693 |
| 7,378,602 | B2 | * | 5/2008 | Ikeda | 174/262 |
| 2004/0245623 | A1 | * | 12/2004 | Hara et al. | 257/698 |
| 2008/0190655 | A1 | * | 8/2008 | Davoine et al. | 174/257 |

* cited by examiner

*Primary Examiner* — Angel R Estrada
*Assistant Examiner* — Dimary Lopez
(74) *Attorney, Agent, or Firm* — Schmeiser Olsen & Watts LLP

(57) ABSTRACT

A circuit board surface structure and a fabrication method thereof are proposed. The circuit board surface structure includes: a circuit board having a plurality of electrically connecting pads formed on at least one surface thereof; a first and a second insulating protective layers formed on the surface of the circuit board in sequence; first and a second openings respectively formed in the first and second insulating protective layers to expose the electrically connecting pads on the surface of the circuit board, wherein the first and second openings have narrow top and wide bottom and the diameter of the first openings is bigger than that of the second openings; and conductive elements formed in the first and second openings on surfaces of the electrically connecting pads. The present structure facilitates to strengthen the bonding between the conductive elements and the corresponding electrically connecting pads.

8 Claims, 7 Drawing Sheets

US 8,164,003 B2

CIRCUIT BOARD SURFACE STRUCTURE AND FABRICATION METHOD THEREOF

BACKGROUND OF THE INVENTION

1. Field of the Invention

The present invention relates generally to a circuit board surface structure and fabrication method thereof, and more particularly to a method of forming conductive elements on electrically connecting pads on a circuit board surface structure for electrically connecting with an external device.

2. Description of Related Art

According to flip-chip technology nowadays, an IC semiconductor chip has electrode pads disposed on an active surface thereof, an organic circuit board has electrically connecting pads corresponding to the electrode pads. A solder structure or other conductive adhesive material is formed between the electrode pads of the semiconductor chip and the electrically connecting pads of the circuit board for providing electrical and mechanical connection between the semiconductor chip and the circuit board.

As shown in FIG. 1, flip-chip technology involves forming a plurality of metal bumps 11 on surfaces of the electrode pads 12 of a semiconductor chip 13, and forming a plurality of pre-solder structures 14 made of solder on surfaces of electrically connecting pads 15 of a circuit board 16. At a reflow temperature sufficient to melt the pre-solder structures 14, the pre-solder structures 14 are reflowed to form solder joints 17 on the metal bumps 11. Then, an underfill material 18 is filled between the semiconductor chip 13 and the circuit board 16 so as to ensure integrity and reliability of electrical connection between the semiconductor chip 13 and the circuit board 16.

FIGS. 2A to 2D are cross-sectional views showing a conventional stencil printing method for depositing solder material on electrically connecting pads of a circuit board. As shown in FIGS. 2A and 2B, a circuit board 20 having electrically connecting pads 201 on a surface thereof is provided. A solder mask layer 21 is a photoimagable polymer coated on the surface of the circuit board 20 and a mask 22 is formed on the solder mask layer 21. The mask 22 has opaque regions 22a corresponding to the electrically connecting pads 201 such that by exposure and development, openings 210 can be formed in the solder mask layer 21 to expose the electrically connecting pads 201. However, in the exposure process, due to diffraction, light is deflected toward regions under the opaque regions 22a, thus forming light deflection path S as shown in FIG. 2A. As a result, part of the solder mask layer 21 under the opaque regions 22a is exposed to the light, which makes the openings 210 formed later through the development process have a tapered downward shape with wide top and narrow bottom. As shown in FIG. 2C, a stencil 23 having a plurality of grids 23a is disposed on the surface of the circuit board 20, wherein the grids 23a correspond in position to the electrically connecting pads 201. Solder material is applied to a surface of the stencil 23. Then, a roller 24 is rolled back and forth on the stencil 23 such that the solder material is disposed in the grids 23a of the stencil 23. Alternatively, a spraying method can be used to dispose the solder material in the grids 23a. The stencil 23 is removed, and then solder (not shown) is formed on the electrically connecting pads 201. Afterward, as shown in FIG. 2D, a reflow-soldering process is performed at the reflow temperature such that the solder is reflowed to form solder bumps 25 on the electrically connecting pads 201 of the circuit board 20. Thus, solder structures are formed on the circuit board by stencil printing technology.

To meet the demand for miniaturized, multi-function electronic products, circuit boards feature increasingly crowded circuits and increasingly thin layers. Hence, high-density, multi-pin packages have to come with reduced circuit width and small electrically connecting pads. Therefore, with a reducing pitch between circuits such as electrically connecting pads, openings in the solder mask layer on the electrically connecting pads are becoming smaller. As a result, the contact area between the solder structures to be formed later and the electrically connecting pads is reduced. Thus, the solder structures cannot be easily formed on the surfaces of the electrically connecting pads, and requirement for fine pitch between electrically connecting pads of advanced electronic products cannot be met.

Each of the openings 210 in the solder mask layer 21 is tapered downward and therefore has a wide top and a narrow bottom, and thus each of the solder bumps 25 has a wide top and a narrow bottom. As a result, a reduced contact area between the solder bumps 25 and the electrically connecting pads 201 accompanies reduced bonding between the solder bumps 25 and the electrically connecting pads 201. Furthermore, the solder bumps 25 in the openings 210 have no embedding structure, and thus the solder bumps 25 are likely to detach from the openings 210.

Therefore, there is a need to provide a circuit board surface structure and a fabrication method thereof that can facilitate forming of solder structures on electrically connecting pads of a circuit board so as to meet requirement for fine pitch between electrically connecting pads of advanced electronic products.

SUMMARY OF THE INVENTION

According to the above drawbacks, an objective of the present invention is to provide a circuit board surface structure and a fabrication method thereof so as to strengthen bonding between conductive elements and electrically connecting pads on a circuit board.

Another objective of the present invention is to provide a circuit board surface structure and a fabrication method thereof so as to meet requirement for fine pitch between electrically connecting pads of advanced electronic products.

In order to attain the above and other objectives, the present invention provides a circuit board surface structure which comprises: a circuit board having a plurality of electrically connecting pads formed on at least one surface thereof; first and second insulating protective layers formed on the surface of the circuit board in sequence; first and second openings respectively formed in the first and second insulating protective layers to expose the electrically connecting pads on the surface of the circuit board, wherein the first and second openings are tapered upward, and the diameter of the first openings is bigger than that of the second openings; and conductive elements formed in the first and second openings on surfaces of the electrically connecting pads.

The first and second insulating protective layers have different composition ratios, the composition ratio of photo-polymerization material (such as an acrylate-based material) in the first insulating protective layer is smaller than the composition ratio of photo-polymerization material in the second insulating protective layer. In other words, while both the first and second insulating protective layers are made of a photosensitive polymer, the first insulating protective layer features presence or absence of a solder resisting effect, and the second insulating protective layer features presence of a solder resisting effect.

The conductive elements can be solder or metal bumps, wherein the solder is made of one selected from the group consisting of Pb, Sn, Ag, Cu, Au, Bi, Sb, Zn, Ni, Zr, Mg, In, Te, and Ga. The metal bumps are made of copper.

The circuit board surface structure according to the present invention further comprises a conductive layer between the electrically connecting pads and the conductive elements. The conductive layer is made of one selected from the group consisting of Cu, Sn, Ni, Cr, Ti, and Cu—Cr alloy. Alternatively, the conductive layer can be made of a conductive polymer.

The present invention further discloses a fabrication method of a circuit board surface structure, which comprises: providing a circuit board with at least one surface formed with a plurality of electrically connecting pads; forming on the surface of the circuit board a first insulating protective layer and a second insulating protective layer in sequence; forming first openings and second openings penetrating the first and second insulating protective layers respectively so as to expose the electrically connecting pads on the surface of the circuit board, wherein the first and second openings are tapered upward, and the diameter of the first openings is bigger than that of the second openings; and forming conductive elements on surfaces of the electrically connecting pads in the first and second openings.

The first and second insulating protective layers have different composition ratio, the composition ratio of photo-polymerization material (such as an acrylate-based material) in the first insulating protective layer is smaller than the composition ratio of photo-polymerization material in the second insulating protective layer. While both the first and second insulating protective layers are made of a photosensitive polymer, the first insulating protective layer features presence or absence of a solder resisting effect, and the second insulating protective layer features presence of a solder resisting effect.

The method for fabricating the conductive elements comprises: forming a conductive layer on a surface of the second insulating protective layer and in the first and second openings; forming a resist layer on the conductive layer and forming third openings in the resist layer to expose the conductive layer on surfaces of the electrically connecting pads; forming conductive elements in the third openings on the surface of the electrically connecting pads by electroplating; and removing the resist layer and the conductive layer covered by the resist layer.

The conductive layer is made of one of the group consisting of Cu, Sn, Ni, Cr, Ti and Cu—Cr alloy. Alternatively, the conductive layer can be made of a conductive polymer.

The conductive elements can be solder or metal bumps. The solder is made of one selected from the group consisting of Pb, Sn, Ag, Cu, Au, Bi, Sb, Zn, Ni, Zr, Mg, In, Te, and Ga. The metal bumps are made of copper. The resist layer is formed on the conductive layer by printing, spin coating, or attaching, and patterned by exposure and development.

Alternatively, the conductive elements of solder can be formed in the first and second openings by stencil printing.

Therefore, the fabrication method of a circuit board surface structure according to the present invention mainly comprises forming a first and a second insulating protective layers of different composition ratios on a surface of a circuit board having electrically connecting pads so as to make the first openings have bigger diameter than the second openings and make the first and second openings have positive taper shape with narrow top and wide bottom, thereby strengthening the bonding of the conductive elements in the first and second insulating protective layers. Accordingly, the present invention solves the conventional problem that the conductive elements cannot be easily attached to surface of the electrically connecting pads and meets requirement for fine pitch between electrically connecting pads of high-end electronic products.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

A main characteristic of the present invention is a first and a second insulating protective layers having different composition ratios are formed on a surface of a circuit board so as to facilitate forming of first and second openings having different diameters in the first and second insulating protective layers. Thus, conductive elements can be formed in the first and second openings by electroplating or stencil printing and firmly bonded in the first and second openings.

FIGS. 3A to 3H are cross-sectional views showing a fabrication method of a circuit board surface structure according to a preferred embodiment of the present invention.

Figure 1:
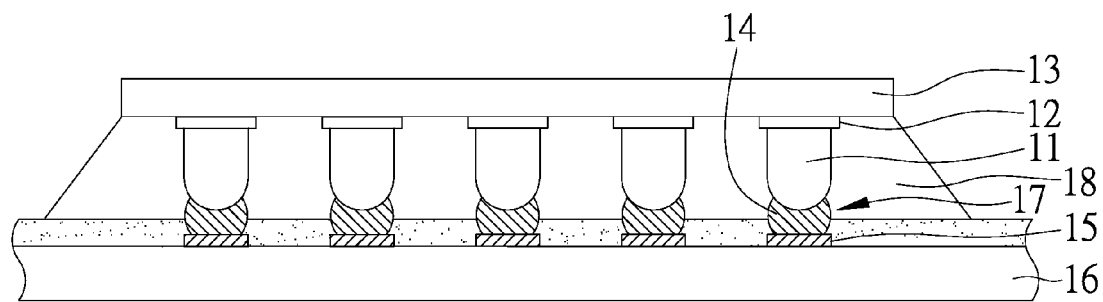
FIG. 1 is a cross-sectional view of a conventional flip chip structure.
Figure 2A:
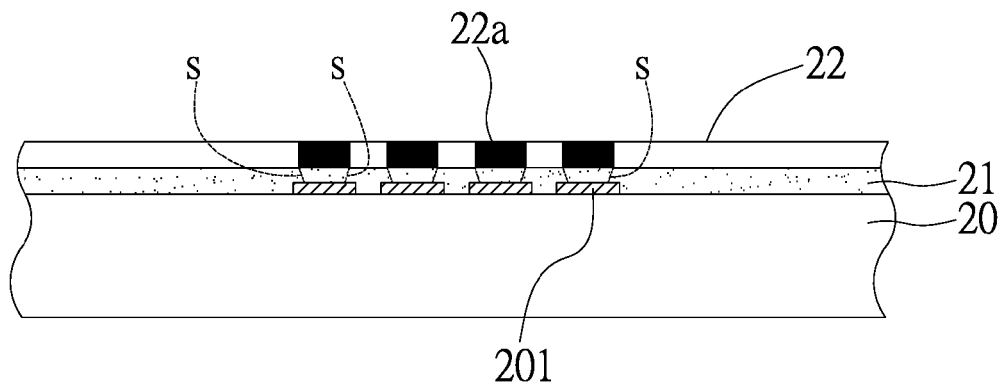
FIGS. 2A to 2D are cross-sectional views showing a conventional stencil printing method for depositing solder material on electrically connecting pads of a circuit board.
Figure 2B:
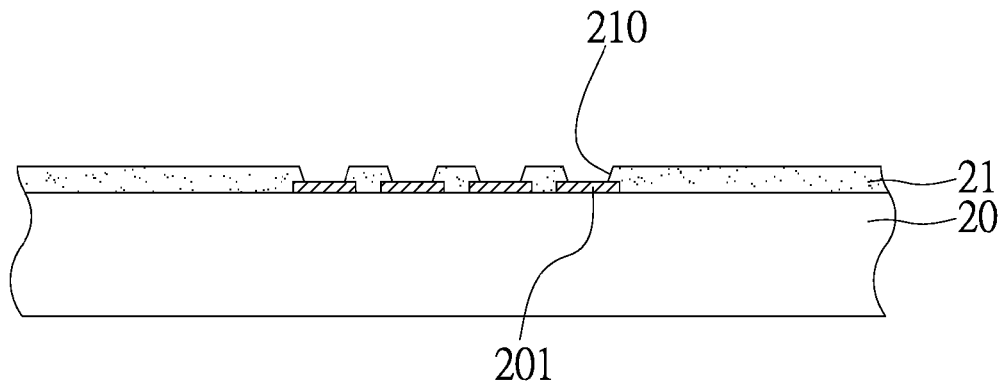
Figure 2C:
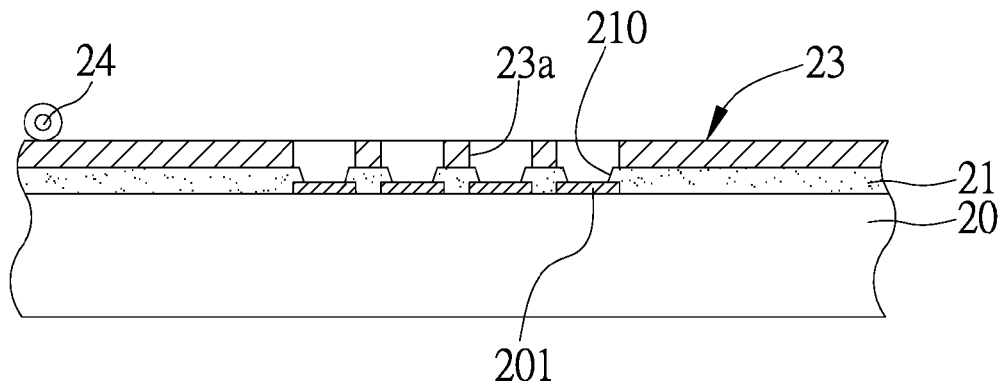
Figure 2D:
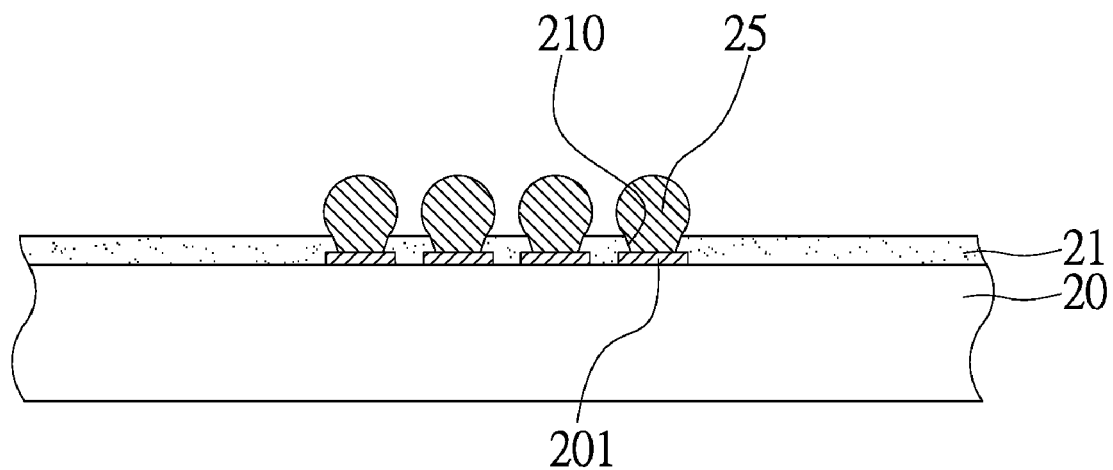
Figure 3A:
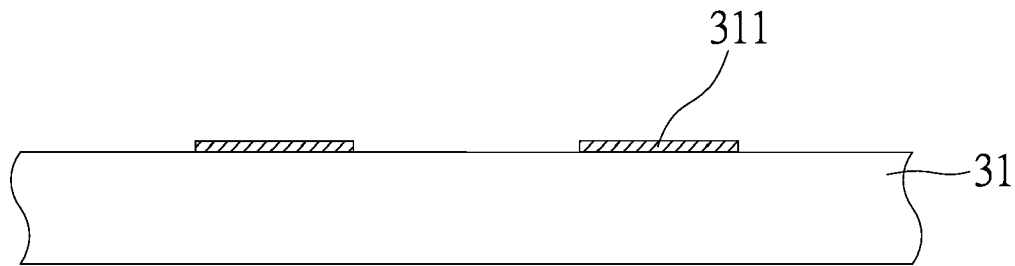
FIGS. 3A to 3H are cross-sectional views showing a fabrication method of a circuit board surface structure according to the present invention.

Referring to FIG. 3A, a circuit board 31 that has undergone a circuit patterning process is provided. The circuit board 31 has a plurality of electrically connecting pads 311 formed on at least one surface thereof, and meanwhile a plurality of conductive circuits (not shown) can be formed on the circuit board 31. Various techniques in the prior art can be used to form the conductive circuits and the electrically connecting pads on the circuit board. Since the techniques are well known in the art and not characteristic of the present invention, detailed description thereof is omitted.

Figure 3B:
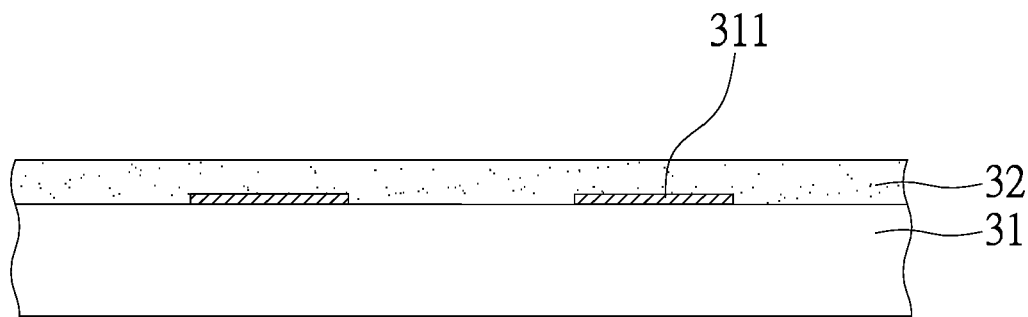

As shown in FIG. 3B, a first insulating protective layer 32 is formed on the surface of the circuit board 31 having the electrically connecting pads 311. In the present embodiment, the first insulating protective layer 32 can be formed on the surface of the circuit board 31 by printing, spin coating, or attaching.

Figure 3C:
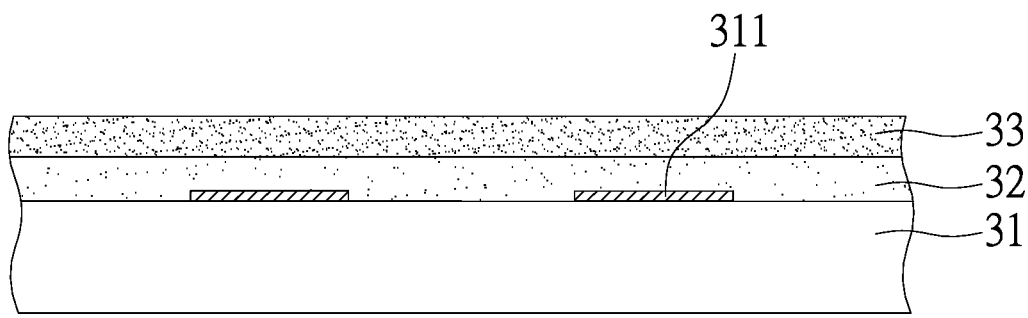

Then, as shown in FIG. 3C, a second insulating protective layer 33 is formed on the first insulating protective layer 32. In the present embodiment, the second insulating protective layer 33 can be formed on a surface of the first insulating protective layer 32 by printing, spin coating, or attaching.

In the present invention, the first and second insulating protective layers 32, 33 have different composition ratios, wherein the composition ratio of photo-polymerization material (such as an acrylate-based material) in the first insulating protective layer 32 is smaller than the composition ratio of photo-polymerization material in the second insulating protective layer 33. While both the first and second insulating protective layers 32, 33 are made of a photosensitive polymer, the first insulating protective layer 32 features presence or absence of a solder resisting effect, and the second insulating protective layer 33 features presence of a solder resisting effect.

Figure 3D:
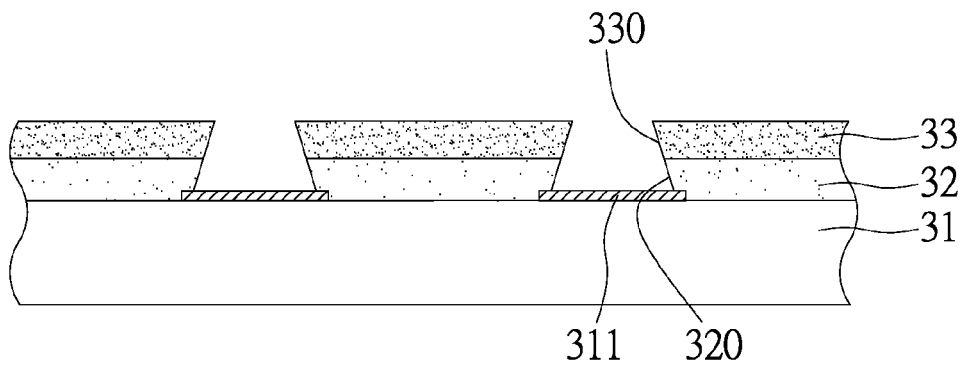

As shown in FIG. 3D, an exposure process is performed to the first and second insulating protective layers 32, 33 at positions corresponding to the electrically connecting pads 311 on the surface of the circuit board 31. As the composition ratio of the photo-polymerization material in the first insulating protective layer 32 is smaller than the composition ratio of the photo-polymerization material in the second insulating protective layer 33, the second insulating protective layer 33 is much easier to harden upon exposure to light. Then through a development process, first openings 320 and second openings 330 are respectively formed in the first and second insulating protective layers 32, 33 to expose surface of the electrically connecting pads 311. Therein, the first and second openings 320, 330 have positive taper shape with narrow top and wide bottom, and diameter of the first openings 320 is bigger than that of the second openings 330, thereby exposing much bigger contact area of the electrically connecting pads 311.

Figure 3E:
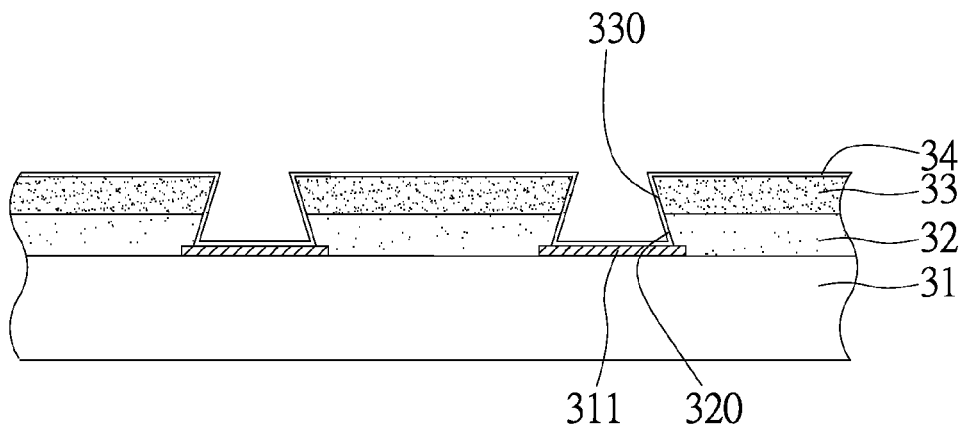

As shown in FIG. 3E, a conductive layer 34 is formed on a surface of the second insulating protective layer 33, in the first and second openings 320, 330 and on surfaces of the electrically connecting pads 311 so as to function as a current conductive path for an electroplating process to be performed later. The conductive layer 34 can be made of a metal material, an alloy or formed by depositing several metal layers. For example, the conductive layer 34 may be made of one of the group consisting of Cu, Sn, Ni, Cr, Ti and Cu—Cr alloy. Alternatively, the conductive layer 34 may be made of a conductive polymer material such as polyacetylene, polyaniline or organosulfur polymer.

Figure 3F:
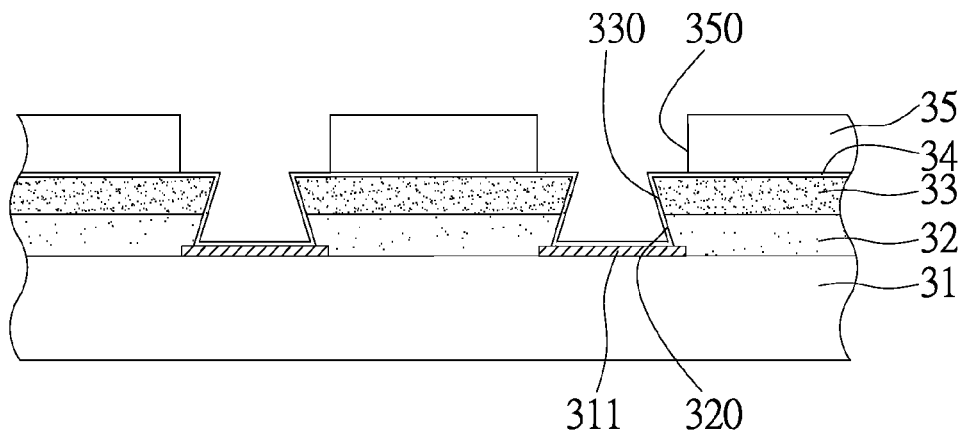

Referring to FIG. 3F, a resist layer 35 is formed on the circuit board 31 and third openings 350 are formed in the resist layer 35 corresponding in position to the electrically connecting pads 311 so as to expose the conductive layer 34 on the surfaces of the electrically connecting pads 311. The resist layer 35 may be made of a dry film photoresist or a liquid photoresist, which is formed on the surface of the conductive layer 34 by printing, spin coating, or attaching, and patterned by exposure and development to form the third openings 350. The diameter of the third openings 350 is bigger than that of the second openings 330.

Figure 3G:
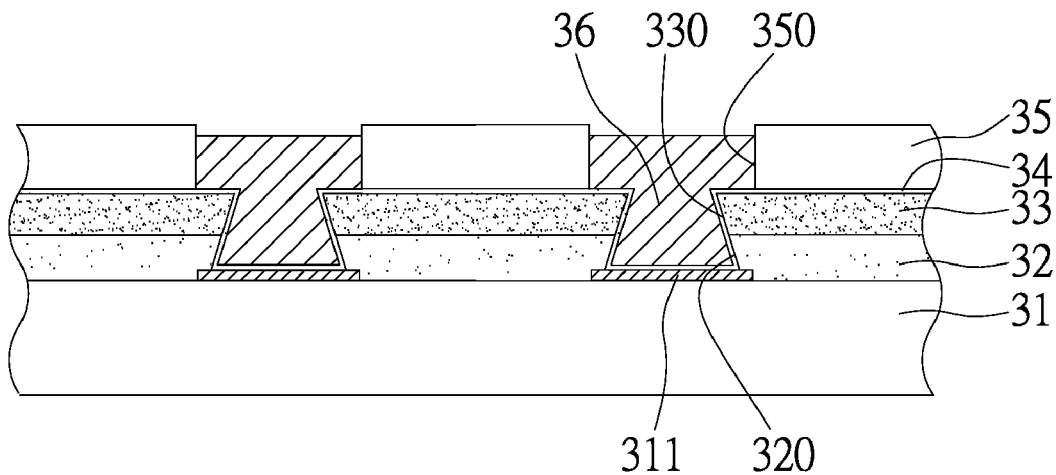

Referring to FIG. 3G, with the conductive layer 34 exhibiting conductivity and therefore functioning as an electrical conduction path, an electroplating process is performed to the circuit board 31 so as to electroplate and form conductive elements 36, which are implemented as solder or metal bumps, on the electrically connecting pads 311 in the third openings 350 of the resist layer 35. The solder is made of one selected from the group consisting of Pb, Sn, Ag, Cu, Au, Bi, Sb, Zn, Ni, Zr, Mg, In, Te, and Ga. The metal bumps are made of copper. The first and second openings 320, 330 are tapered upward, so as to provide a relatively great contact area between the electrically connecting pads 311 and the conductive elements 36. The upwardly-tapered first and second openings 320, 330 enable the conductive elements 36 to be embedded in the first and second insulating protective layers 32, 33, thus strengthening the bonding between the conductive elements 36 and the corresponding electrically connecting pads 311 and efficiently preventing detachment of the conductive elements 36 from the surfaces of the electrically connecting pads 311.

Figure 3H:
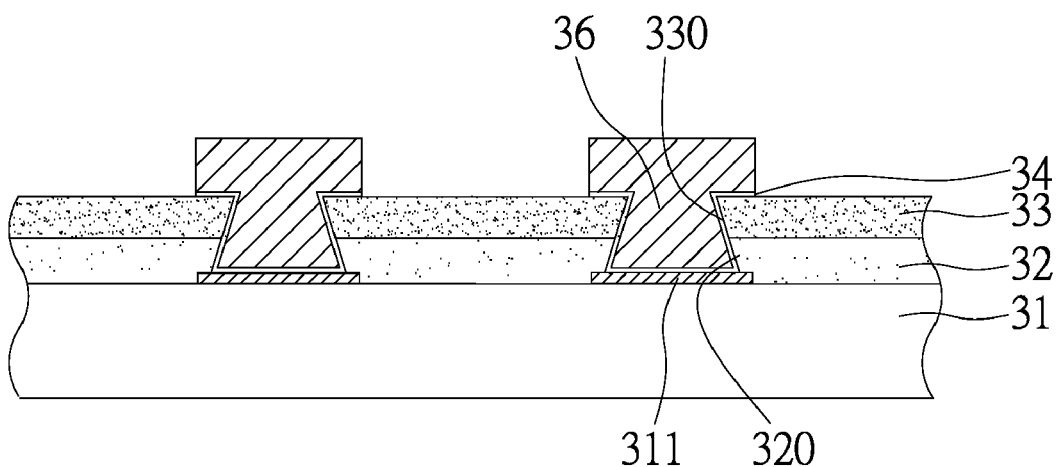

As shown in FIG. 3H, the resist layer 35 and the conductive layer 34 covered by the resist layer 35 are removed. Since the removing process is well known in the art, detailed description thereof is omitted herein.

Figure 4:
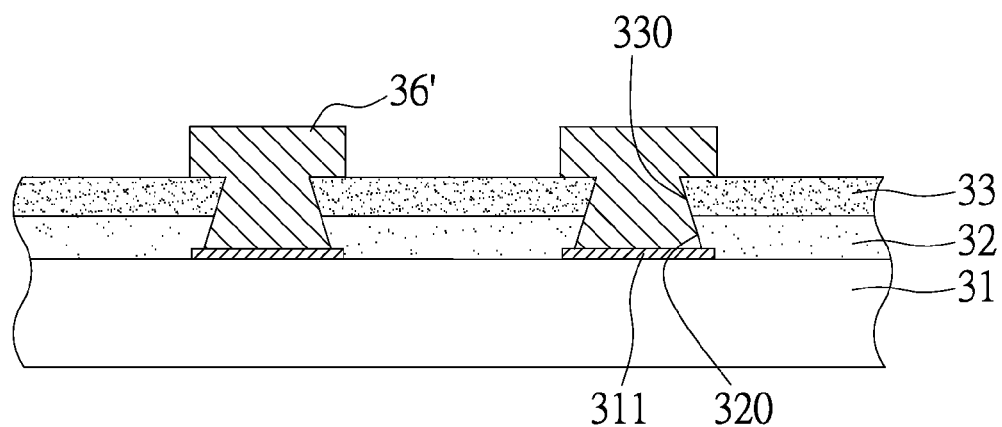
FIG. 4 is a cross-sectional view showing a stencil printing method for forming conductive elements of the circuit board surface structure according to the present invention.

Alternatively, referring to FIG. 4, conductive elements 36' such as solder are formed in the first and second openings 320, 330 by a stencil printing process.

Therefore, the fabrication method of a circuit board surface structure according to the present invention mainly comprises forming a first and a second insulating protective layers of different composition ratios on a surface of a circuit board having electrically connecting pads, such that the first openings have a bigger diameter than the second openings, and each of the first and second openings is tapered upward, thereby strengthening the bonding of the conductive elements in the first and second insulating protective layers and preventing detachment of the conductive elements from the surfaces of the electrically connecting pads so as to meet requirement for fine pitch between electrically connecting pads of advanced electronic products.

The above descriptions of the detailed embodiments merely serve to illustrate the preferred implementation according to the present invention, and it is not intended to limit the scope of the present invention. Accordingly, all modifications and variations completed by those with ordinary skill in the art should fall within the scope of present invention defined by the appended claims.

What is claimed is:

1. A circuit board surface structure, comprising:
a circuit board with at least one surface having a plurality of electrically connecting pads;
a first insulating protective layer and a second insulating protective layer formed on the surface of the circuit board in sequence;
a first opening and a second opening penetratingly formed in the first and second insulating protective layers respectively to expose the electrically connecting pads on the surface of the circuit board, wherein the first and second openings are tapered upward, and the first opening has a greater diameter than the second opening; and
conductive elements formed on a part of the top surface of the second insulating protective layer and surfaces of the electrically connecting pads in the first and second openings, wherein each of the conductive elements is a solder or a metal bump, and the width of each of the conductive elements formed on a part of the top surface of the second insulating protective layer is larger than width of the second opening.

2. The circuit board surface structure of claim 1, wherein the first and second insulating protective layers have different composition ratios.

3. The circuit board surface structure of claim 2, wherein the composition ratio of photo-polymerization material in the first insulating protective layer is smaller than the composition ratio of photo-polymerization material in the second insulating protective layer.

4. The circuit board surface structure of claim 2, wherein photo-polymerization material in the first and second insulating protective layers is an acrylate-based material.

5. The circuit board surface structure of claim 2, wherein the first insulating protective layer features one of presence and absence of a solder resisting effect, and the second insulating protective layer features presence of a solder resisting effect.

6. The circuit board surface structure of claim 1, further comprising a conductive layer disposed between the electrically connecting pads and the conductive elements, between a wall of the first opening and the conductive elements, between a wall of the second opening and the conductive elements, and between the second insulating protective layer and the conductive elements.

7. The circuit board surface structure of claim 1, wherein the solder is made of one selected from the group consisting of Pb, Sn, Ag, Cu, Au, Bi, Sb, Zn, Ni, Zr, Mg, In, Te, and Ga.

8. The circuit board surface structure of claim 1, wherein the metal bump is made of Cu.

* * * * *